United States Patent [19]

Throop et al.

[11] Patent Number: 5,243,143
[45] Date of Patent: Sep. 7, 1993

[54] SOLDER SNAP BAR

[75] Inventors: David B. Throop, Houston; Duane L. Sevy, Spring, both of Tex.

[73] Assignee: Compaq Computer Corporation, Houston, Tex.

[21] Appl. No.: 612,529

[22] Filed: Nov. 13, 1990

[51] Int. Cl.⁵ .............................. H05K 1/00
[52] U.S. Cl. .................. 174/263; 361/767; 228/180.1
[58] Field of Search ............... 174/250, 255, 256, 263; 361/403, 404, 405, 406, 407; 228/180.1; 357/70

[56] References Cited

U.S. PATENT DOCUMENTS

| | | | |
|---|---|---|---|
| 4,339,784 | 7/1982 | Shearer | 361/403 |
| 4,835,345 | 5/1989 | Haarde | 174/263 X |
| 4,882,839 | 11/1989 | Okada | 174/262 X |
| 4,914,259 | 4/1990 | Kobayashi et al. | 174/255 |
| 4,987,475 | 1/1991 | Schlesinger et al. | 357/70 |

FOREIGN PATENT DOCUMENTS 1-289197  11/1989  Japan .................. 228/180.1

Primary Examiner—Leo P. Picard
Assistant Examiner—Trinidad Korka
Attorney, Agent, or Firm—Synnestvedt & Lechner

[57] ABSTRACT

Improved printed circuit boards and methods of soldering them are provided in which a snap bar is provided on the conductor side of a printed circuit board for reducing defects, such as bridging, during soldering. This and other provided process and design techniques, such as lead lengths, orientation, mask finish, and the location of the leads on the board, have significantly reduced reworking and defective components and are especially effective when applied to 50 mil connector products.

15 Claims, 7 Drawing Sheets

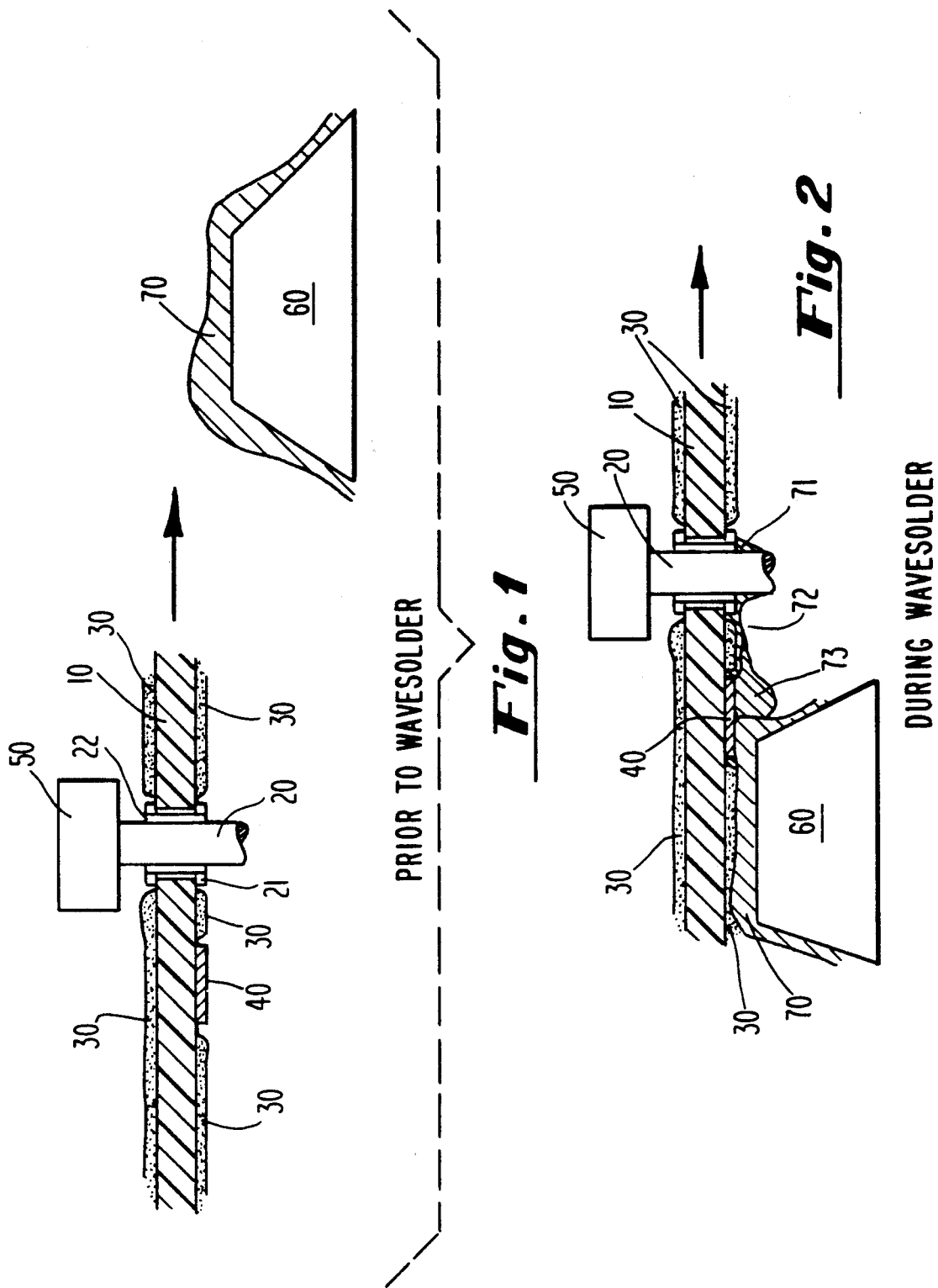

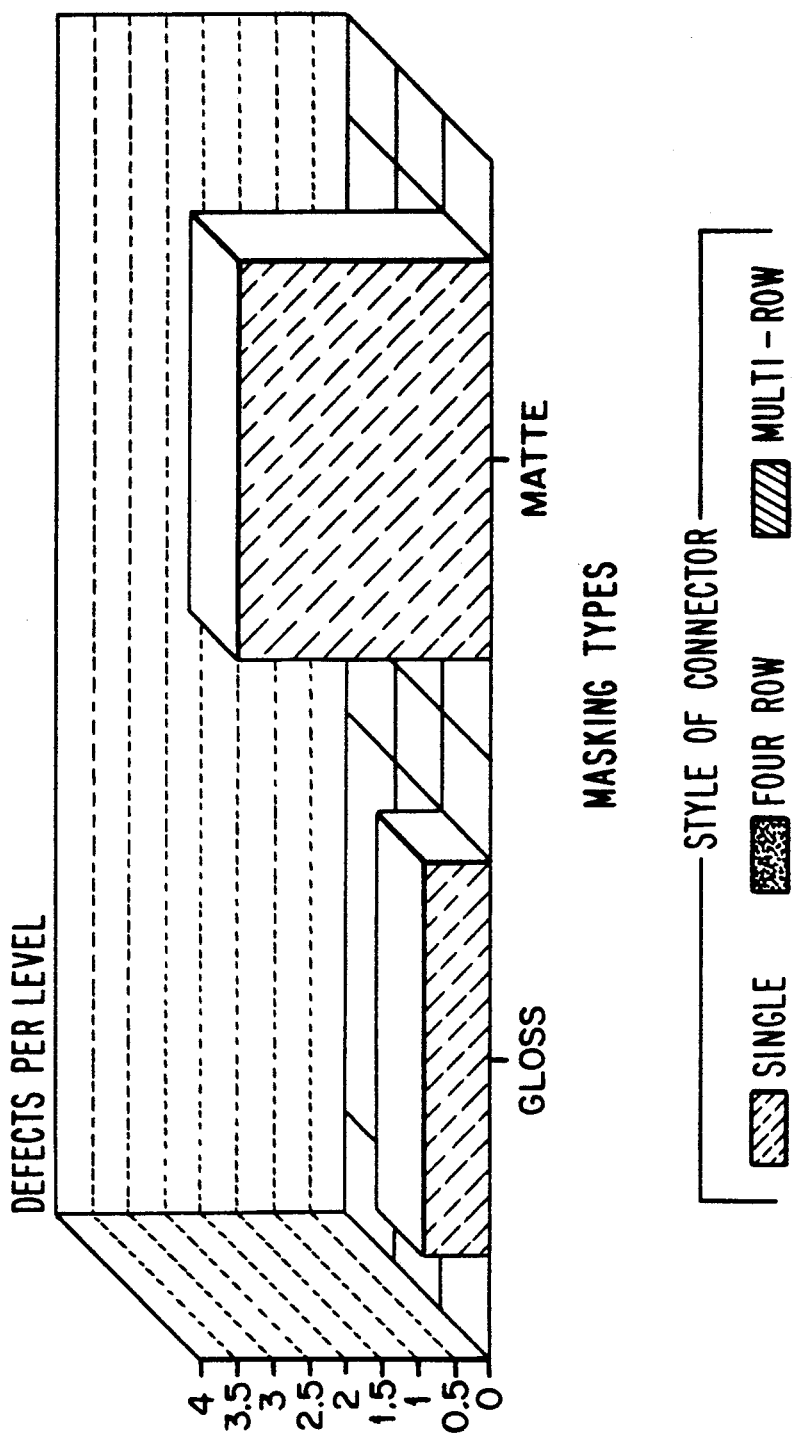

SOLDER SNAP BAR

FIELD OF THE INVENTION

This invention relates to the preparation of the conductor side of printed circuit boards, and more particularly, to methods and designs for minimizing bridging across the leads of integrated circuits and fine pitch connectors during soldering.

BACKGROUND OF THE INVENTION

The processing of the printed circuit boards generally involves producing a laminated board having an epoxy based substrate with layers of etched copper conductors thereon, and one or more semi-conductor chip components or connectors attached to the board by tiny lead wires. A particularly common configuration for these lead wires is a dual in-line pin, commonly called a D-I-P package. This configuration appears as two rows of electrical leads projecting from opposite edges of the component and bent at 90°, such that the leads project downward from the plane of the chip.

Chip components are typically mounted to the printed circuit board by inserting the component leads into holes disposed through the board which extend from the component side of the board to the conductor side of the board. Surrounding each of these holes on the conductor side of the circuit board is a solder pad. A known technique for securing the chip components and connectors to the board by their leads is to mask a portion of the lower side of the board to create a pattern, flux the exposed surfaces, preheat, and then pass the conductor side of the board through a smooth wave of molten solder in a process called wave soldering.

During the wave solder process, molten solder is pumped up and over support plates to form a wave. The printed circuit board is passed over the solder wave by a conveyer at an angle such that the conductor side of the board contacts the leading edge of the solder wave. Component leads are soldered to the solder pads on the printed circuit board and the holes, which are often pre-plated, are filled with solder by capillary action.

If two clean metal surfaces are held together and dipped into the molten solder, the solder will wet the metal and climb up to fill the gaps between the adjacent surfaces. This phenomena is the result of capillary attraction. Wave soldering processes rely on this phenomena to produce a fillet of solder both on the component side of the circuit board and surrounding the portion of the lead which projects through the holes to the conductor side of the circuit board. Unfortunately, however, capillary attraction can produce unwanted solder bridging between closely spaced component leads.

In recent years, the dramatic increase in packaging density of through-hole connectors has led to smaller and smaller lead spacing, which can be as little as 0.050 in (0.127 cm), hereinafter "50 mil". At such spacings, the problem of bridging, especially on the trailing edge of the leads, can be severe.

The art has been replete with many attempts to alleviate the bridging problem. Process parameters such as wave height, conveyers speed, pre-heat temperatures, flux types, and solder temperatures have all been attempted, but have been unsuccessful. For some components, it is still necessary to manually remove the solder bridges by reheating the connections and removing the excess solder with a vacuum device such as "solder sucker" or with a copper braid which wicks molten solder. These are extremely expensive and time-consuming processes and the required remelting can weaken the solder connections. Other techniques have also been developed which have proved promising, but have been relatively ineffective in eliminating bridging in 50 mil components. See Shearer, U.S. Pat. No. 4,339,784, (hereinafter '784), and Haarde, U.S. Pat. No. 4,835,345, (hereinafter '345), which are hereby incorporated by reference.

Shearer '784 discloses a solder draw pad consisting of additional foil pads, or dummy solder pads, arranged in line with the row of leads. The additional foil pad or pads draws off excess solder to reduce the solder bridging between adjacent leads during the soldering operation. The disclosed solder draw pads of this reference are about the same size as the lead solder pads and are spaced in such a way as to form a bridge between the dummy pads and the last row of leads. Although this does not result in a short, such extended pad areas have been known to produce electrical signal distortion or "noise" due to the "antenna effect".

Haarde '345 discloses a robber pad design for receiving and containing excess solder which might otherwise bridge adjacent downstream leads of a component having closely spaced leads. His robber pad is connected to an adjacent upstream solder pad by a solder-wettable bridge. This reference teaches that it is critical that the robber pad or dummy pad be connected by the solder-wettable bridge to the most downstream pad in the linear array of solder pads. Because of the extension of the solder pad, this robber pad configuration is also subject to the antenna effect. Moreover, this design has not proved to be effective in tests for reducing bridging between adjacent leads of high density components.

While in the main such references have provided temporary relief for the bridging problem during some wave soldering processes, there is a need for a more effective technique for solving this problem with high density 50 mil lead spacing components.

SUMMARY OF THE INVENTION

Printed circuit boards and soldering methods are provided for substantially eliminating bridging on even the most densely packed 50 mil lead spacing components. The circuit board of this invention includes an array of insular solder pads each contacting a lead wire disposed through an opening in the board. Also included in its construction is a "snap bar" for drawing an amount of molten solder away from a plurality of solder pads substantially by capillary attraction during the soldering of the board. In an important aspect of this invention, the snap bar is spaced from the array of solder pads on the circuit board and effectively "snaps" the excess solder away from the leads without forming a bridge or separate electrical connection. This separation reduces the antenna effect significantly.

In the novel method of this invention, the conductor side of a printed circuit board is soldered by first providing an array of insular solder pads, each of which contacts a lead wire disposed through an opening in the board. A snap bar is also provided which is spaced from the array of solder pads on the circuit board. Finally, the conductor side of the circuit board is wave soldered, whereby a portion of the solder is simultaneously drawn away from a plurality of the solder pads substantially by capillary attraction to the snap bar.

Accordingly, the circuit boards and soldering processes of this invention substantially eliminate the chances for solder bridging even on the most closely spaced 50 mil connectors. Relying upon the principal of capillary attraction, the surface tension of the snap bar of this invention is greater than that of the leads, and the result is that the snap bar "snaps" away solder from the leads and onto its surface, eliminating excess solder build-up on the leads, and thus, reducing the presence of solder bridging. The increased surface area of the snap bars of this invention and the spacing between the snap bar and the leads, combines to create effective capillary attraction of excess solder to the snap bar. Flexibility of this design makes it well suited for single, dual, and multi-row connectors. The snap bars of this invention can be used to reduce bridging on components that are oriented in both the parallel and perpendicular directions to the wave solder wave.

In other aspects of this invention, printed circuit boards are disposed with their leads oriented 90° to the solder wave for decreasing the number of defects. It has also been discovered that lead lengths protruding of about 0.008–0.23 in (0.020–0.58 cm), and ideally about 0.015 in (0.0381 cm) provide the minimum number of solder defects, both bridges and voids. It has been further discovered that leads located in the center of the printed circuit board fair better than those located at the leading and trailing edges with respect to solder bridges and that gloss masking types produce less solder bridging than matte masks, at least for single row connectors.

BRIEF DESCRIPTION OF THE DRAWINGS

The accompanying drawings illustrate preferred embodiments of this invention so far devised for the practical application of the principles thereof, and in which:

FIG. 1: is a diagrammatic partial cross-sectional side view of a printed circuit board having a snap bar according to this invention prior to contacting a solder wave;

FIG. 2: is a side view of the printed circuit board of FIG. 1 after the solder wave has wetted the plated surfaces;

FIG. 9: is a three dimensional graphical depiction illustrating the effects matte and gloss mask finishes on the number of solder bridges.

DETAILED DESCRIPTION OF THE INVENTION

Figure 3:
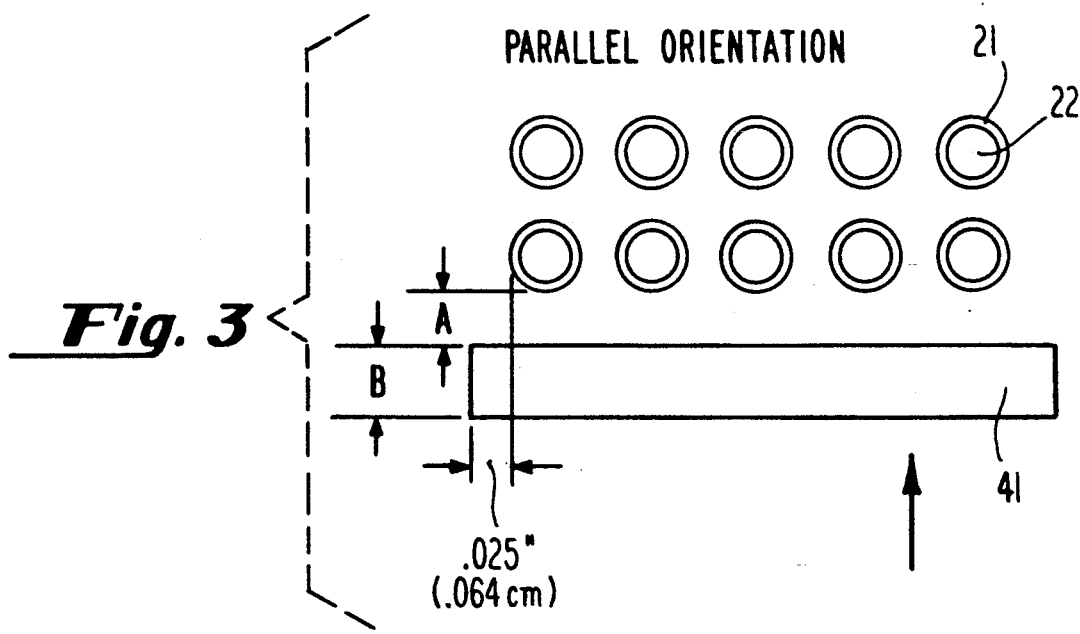
FIG. 3: is a top elevation of a dual row lead design having a preferred snap bar in a parallel orientation.

Improved printed circuit boards and methods for soldering the conductor side of such boards with fewer defects are provided by this invention. In a first embodiment, an array of insular solder pads are provided on a printed circuit board in which each of the solder pads contacts a lead wire disposed through an opening in the board. The board is provided with a snap bar for drawing an amount of molten solder away from a plurality of solder pads substantially by capillary attraction during the soldering of the board. As used herein the term "snap bar" refers to a portion of the circuit board's conductor side which attracts excess solder from the leads but is spaced away from the solder pads even after the solder solidifies to minimize the antenna effect.

In a further aspect of this invention, a method of soldering a conductor side of a printed circuit board is provided. The method includes the steps of providing a printed circuit board with an array of insular solder pads in which the solder pads contact lead wires disposed through openings in the board. The board is provided with a snap bar spaced from the array of solder pads on the surface of the circuit board. This method further includes wave soldering a conductor side of the board whereby a portion of the solder is drawn away from a plurality of the solder pads by the snap bar substantially by capillary attraction in a "snap" action. As used herein the term "capillary attraction" refers to the ability of the snap bar to create an attractive force to the molten solder greater than the internal cohesion of the liquid solder itself and greater than that provided by the individual solder pads. It is understood however, that a sufficient amount of solder will remain around the leads to adequately bond them to their respective solder pad.

In a more detailed aspect of this invention, a printed circuit board is provided having an array of solder pads in which at least two substantially parallel rows of substantially equally spaced pads are provided. The parallel rows include corresponding first and second row ends. The board is also equipped with a snap bar comprising a discrete plated portion of the printed circuit board equidistantly disposed at least about 0.030 in (0.076 cm) from at least a plurality of the solder pads in the parallel rows for drawing an amount of molten solder away from said plurality of solder pads substantially by capillary attraction during the soldering of the board. In this embodiment, the snap bar includes the capillary surface area of at least about twice that, preferably about three times that, of a first of the plurality of solder pads.

Referring now to the Figures, and more particularly to FIGS. 1 and 2, there is illustrated a schematic of a preferred printed circuit board of this invention being introduced to a wave solder process. During wave soldering, an electrical component 50 is mounted on a printed circuit board 10 with its leads 20 projecting through the board; defining a protruding lead length for the leads. Each lead hole 22 in the board is surrounded by a plated solder pad 21 at least on the conductor side of the circuit board 10. The circuit board 10 typically includes a solder mask 30 for protecting surfaces which are to be solder free. In an important aspect of this invention, the circuit board 10 is also provided with a snap bar 40 disposed preferably at least about 0.030 in (0.076 cm) from the edge of the solder pad 21.

During wave soldering, a solder wave 70 is created in a molten solder pool by a support plate 60. As the printed circuit board 10 is passed through the wave soldering process in the direction shown by the arrow in FIGS. 1 and 2, the lead 20 contacts the solder wave 70. It should be understood that the component 50 may include a D-I-P configuration having two parallel rows of leads, or a connector that might have one, two, or multiple rows of leads. A solder pad design for receiving such a configuration is described in FIGS. 3 and 4. During the soldering process, a fillet of solder 71 forms around each lead bonding it to the surrounding solder pad 21 as shown in FIG. 2, excess solder 73 flows onto the snap bar 40 and snaps away from the solder pad 71 at point 72. The excess solder 73 soon solidifies on the snap bar 40 and reduces the potential for the formation of a solder bridge between the closest lead or leads in the array to the snap bar and the upstream adjacent lead.

The solder pad 21 and snap bar 40 must be solder-wettable. Preferably, these surfaces are clean metal surfaces which are fluxed prior to the wave soldering procedure. The snap bar 40 and solder pad 21 can be provided by masking a copper coated portion of the printed circuit board 10 followed by a tinning procedure which applies a tin-lead plating of about 1.5 mils thick on the raw card.

The dimensions and overall configurations of the snap bars of this invention may vary substantially depending upon the pin arrangement, orientation with respect to the solder wave, and the proximity of adjacent components. These snap bars are "stand-alone" or unattached to the solder pads, so that they may draw excess solder substantially away from the leads. The increased surface area of the snap bars and the space in between the snap bars and the leads, combines to create a true capillary attraction of excess solder to the snap bar. This design can be applied to single, dual, and multi-row connectors, and can also be used to reduce bridging on components that are oriented in both parallel and perpendicular directions to the oncoming solder wave. Preferred pad configurations for various connector types are described in the following table with reference to FIGS. 3 and 4.

TABLE I

| Connector Type | A | B | Pad Sizes |
| --- | --- | --- | --- |
| Single Row | .040" (.102 cm) | .050" (.127 cm) | .040" (.102 cm) O.D. pad shape .034" (.086 cm) × .042" (.107 cm) oval pad |
| Dual Row | .030" (.076 cm) | .040" (.102 cm) | .040" (.102 cm) O.D. pad shape .034" (.086 cm) × .042" (.107 cm) oval pad |
| Multi-Row (6 leads) | .050" (.127 cm) | .075" (.191 cm) | .040" (.102 cm) O.D. pad shape .034" (.086 cm) × .042" (.107 cm) oval pad |

Figure 4:
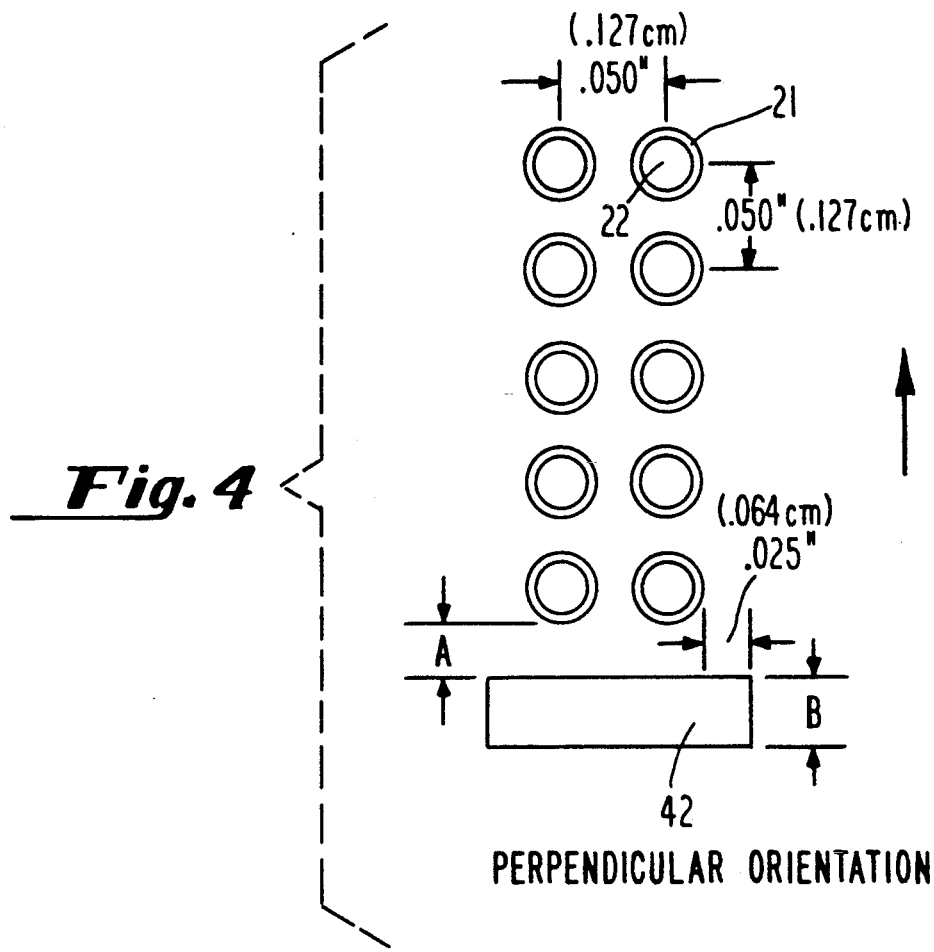
FIG. 4: is a top elevation of the dual row lead design of FIG. 3 illustrating a preferred snap bar in a perpendicular orientation.

In the above embodiments, the snap bars are preferably used on the trailing edge of the component. The preferred snap bars 41 and 42 of FIGS. 3 and 4 are substantially continuous and uniform along their length and extend about 0.025 in (0.063 cm) beyond the edges of the solder pads. As can be appreciated, a much larger snap bar is required in the parallel orientation as opposed to the perpendicular orientation, due to the larger number of solder pads which are affected. It can be further appreciated that the surface area of the snap bars can be changed by simply varying the solder mask opening around the snap bar, i.e., the masking can be applied to overlap the edges of the snap bar itself to reduce its surface area. It is also understood that the snap bar can be a single discrete surface or a plurality of discrete surfaces of sufficient surface area to "snap" away excess solder.

EXAMPLE

In accordance with this invention, experiments were conducted for single, four, and six row ("multi-row") 50 mil connectors. Each printed circuit board of this experiment contained 24 samples of each of the connectors styles, three samples per board. The following factors were controlled during the experiment:

TABLE II

| Experimental Variables | |
| --- | --- |
| Factor | Levels |
| Orientation | 0, 90° to wave |
| Pad Type | 1, 2, 3, 4 |
| Lead Protrusion | 0.000", 0.015" (.038 cm), 0.030" (.076 cm) |
| Location | leading, center, trailing |
| Mask Type | dull, glossy |

For single row connectors, the solder pad configurations were varied according to the following description:

TABLE III

| Single Row Connector Solder Pad Description | |
| --- | --- |
| Number | Description |
| 1 | 0.040" (.102 cm) Annular Ring |
| 2 | 0.040" (.102 cm) Annular Ring with Snap Bar |
| 3 | 0.040" × 0.060" (.102 cm × .153 cm) Oval Pad (Alternating) |
| 4 | 0.040" × 0.060" (.102 cm × .153 cm) Oval Pad |

For the four row and multi (six) row connector, the solder pad configurations were as follows:

TABLE IV

| Four Row and Multi-Row Connector Solder Pad Configurations | |
| --- | --- |
| Number | Description |
| 1 | .034" × .042" (.086 cm × .107 cm) Oval Pad |
| 2 | .034" × .042" (.086 cm × .107 cm) Oval Pad with Snap Bar |
| 3 | .088" (.224 cm) Connected Robber Pad |
| 4 | .088" (.224 cm) Connected Robber Pad (Alternating) |

The snap bar configurations employed with these descriptions are described in TABLE I and the robber pad configurations varied from 0.088–0.092 in (0.224–0.234 cm) in length with small variations in elliptical shape. The response variables for this experiment included the number of solder bridges (pins involved), the number of solder voids (pins involved), and finally the total number of defects (sum of bridges and voids). The sample size for this experiment was 27 samples; three other samples were used to set up the wave soldering parameters prior to running the experiment.

Simulation of process board profiles was achieved by using the following wave solder machine settings to obtain a target top board temperature of 250° F. prior to the board hitting the solder pot.

TABLE V

Wave Solder Parameters

Preheater Settings = 23, 25, 39, 17
Conveyor speed = 4 ft./min.
Flux Type = RMA
Solder Patter = 2 in (LEV-CHECK)
Fluxer Air Pressure = 9 psi (LEV-CHECK)
Dwell Time = 3.00 seconds LEV-CHECK was used to initially verify the solder pattern to the board, and then to verify the amount of solder hitting the board at one time in a 2 in (5.08 cm) strip pattern. The wave solder parameters were set throughout the process and no adjustments were made to the machine during the run of the experiment. No board stiffeners were used on any of the test boards.

Analysis

Statistical information was gathered from these experiments for the factors of orientation, pad type, lead protrusion, location of leads, and mask type.

Figure 5:
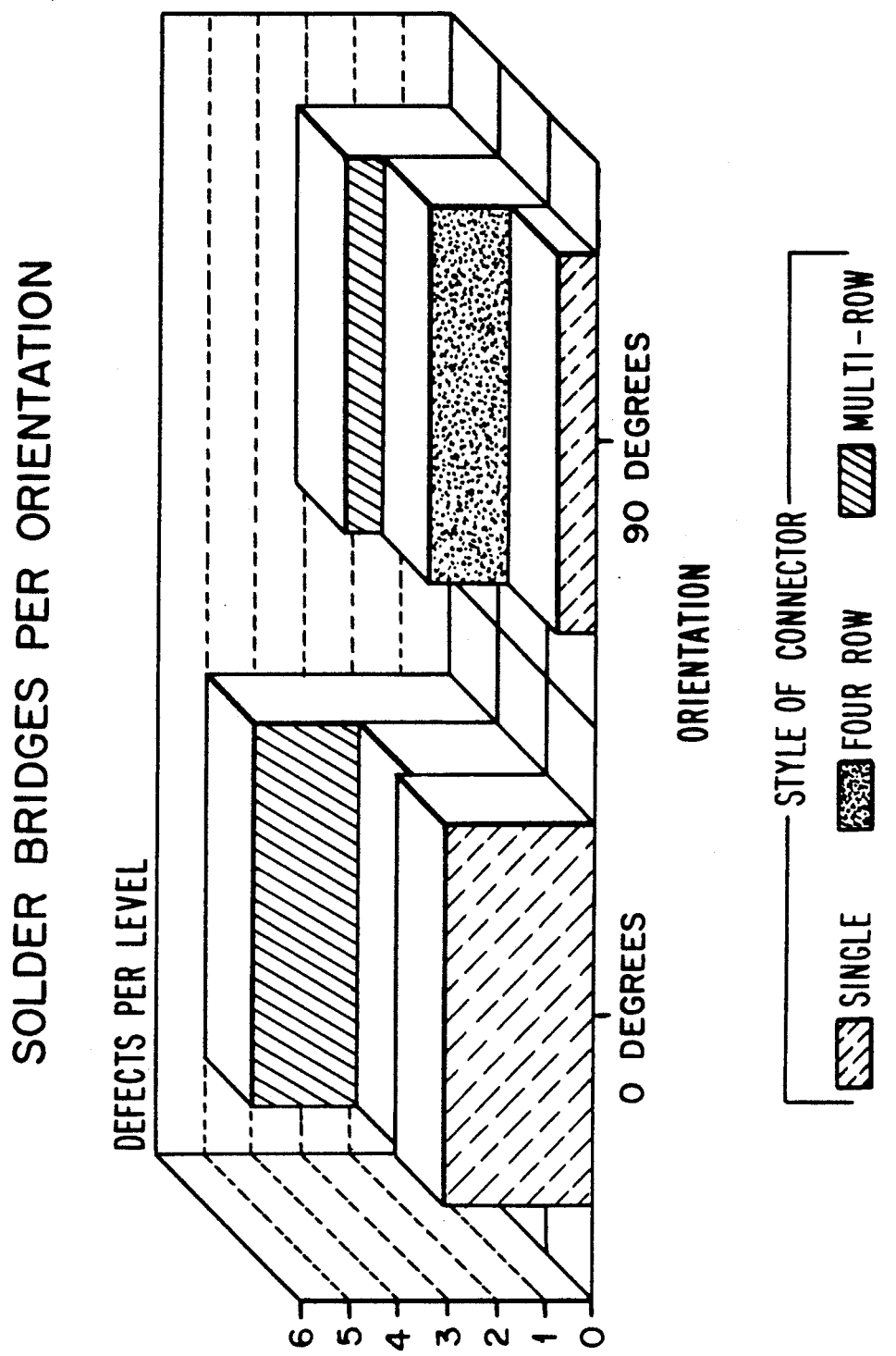
FIG. 5: is a three dimensional graphical depiction illustrating the effects of the orientation of the lead rows with respect to the solder wave and its effect on the level of defects.

With reference to FIG. 5, the number of defects, including voids and bridges, was significantly decreased when the board was disposed with a 90° orientation to the oncoming solder wave. This phenomena was observed for the single, four and multi-row style connectors.

Figure 6:
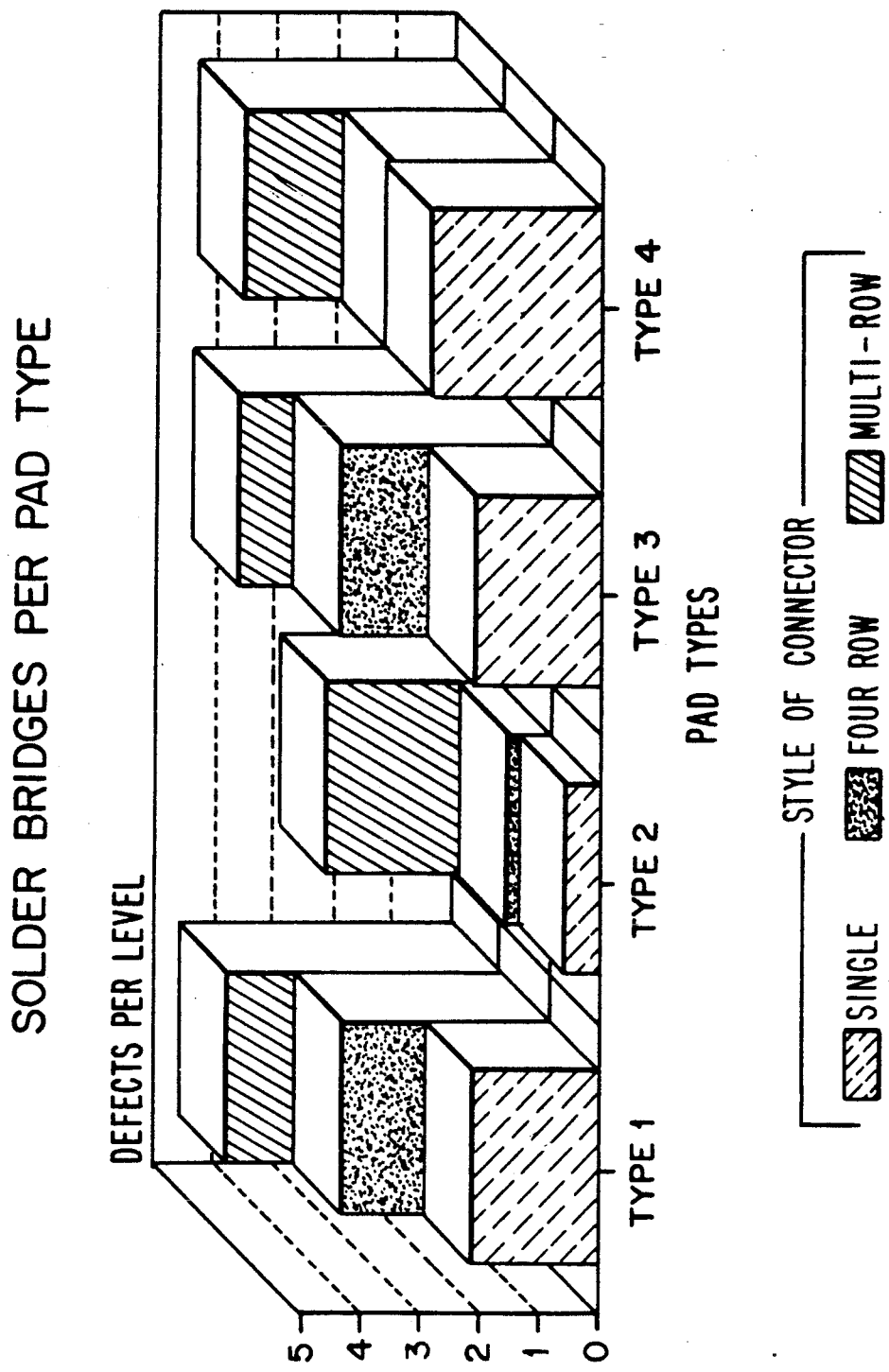
FIG. 6: is a three dimensional graphical depiction illustrating the effects of pad configuration on the number of solder bridges.

With reference to FIG. 6, the solder pad configuration had a definite impact on the number of solder bridges. The number 2 configuration which included solder pads and a snap bar such as disclosed in TABLE I, was significantly better at reducing bridging than the other pad configurations. It was also determined that annular ring solder pad configurations with a snap bar were superior to oval ring solder pad configurations with equivalent snap bars.

Figure 7:
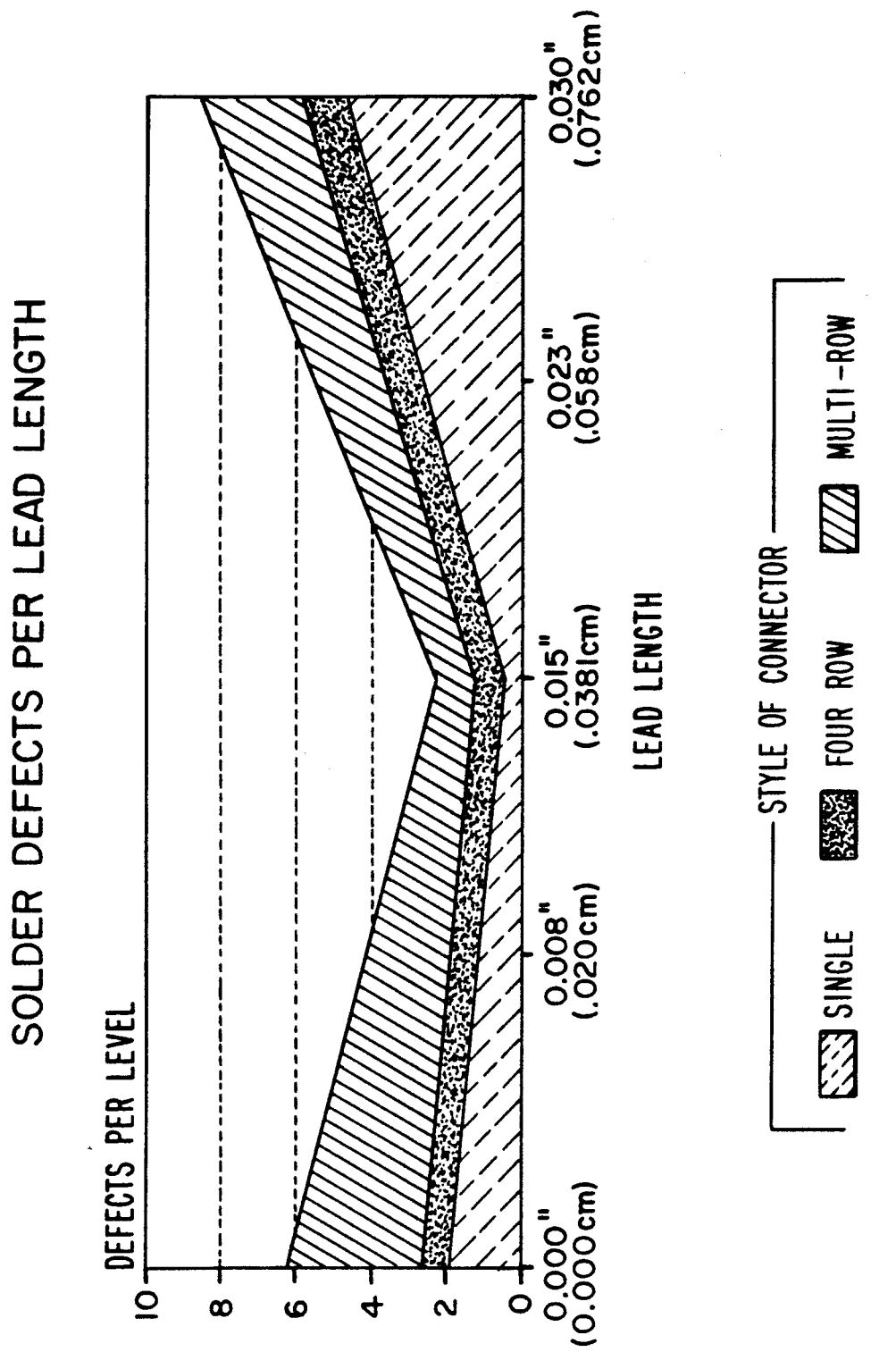
FIG. 7: is a graphical depiction illustrating the effects of lead length on the number of solder defects.

FIG. 7 describes that the total number of defects, voids and bridges, decreased significantly when lead lengths protruding were reduced to the range of 0.008-0.023 in (0.020-0.058 cm) and were at their lowest levels at about 0.015 in (0.0381 cm). Although lead protrusions of about 0.0 in were found to produce less bridging overall, many solder voids were produced. The 0.015 in (0.0381 cm) lead protrusion gave the best results overall when both voids and bridges were included.

Figure 8:
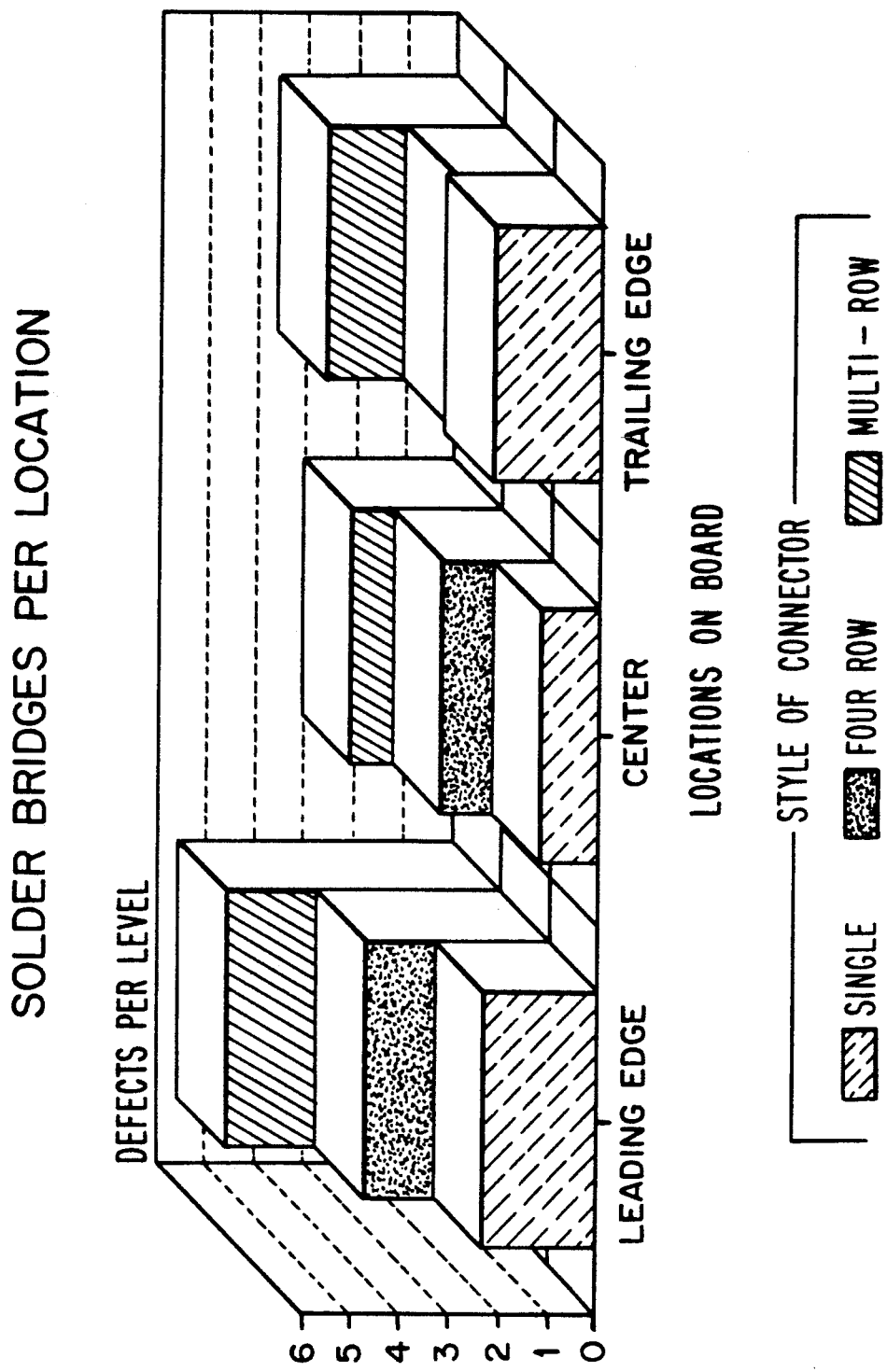
FIG. 8: is a three dimensional graphical depiction illustrating the effects of the location of the pins on the printed circuit board on the number of solder bridges.

Finally, with reference to FIGS. 8 and 9, it was determined that matte masking created a larger amount of defects on single row connectors than gloss masking, but mask finish was not a significant factor in four and multi-row connectors. It was further determined that locating the leads in the center of the board was important for reducing defects in single row connectors but a trailing edge location was more beneficial to four row connectors.

From the foregoing, it can be realized that this invention provides improved printed circuit boards and methods for soldering the conductor side of such boards by minimizing solder bridges and voids. The process steps and design configurations of the solder pads, snap bars, and lead lengths of this invention significantly reduce defects even on small 50 mil connectors during the wave solder process. This reduction in solder bridging and voids reduces the amount of touch-up required per board, increases the quality of the solder joint, and decreases the amount of test failures, rework, and debugging time per board. Although various embodiments have been illustrated, this was for the purpose of describing, and not limiting the invention. Various modifications, which will become apparent to one skilled in the art, are within the scope of this invention.

I claim:

1. A printed circuit board, comprising:
    an array of insular solder pads, each of said solder pads contacting a lead wire disposed through an opening in said board;
    a snap bar having a surface area substantially larger than one of said solder pads for drawing an amount of molten solder away from a plurality of said solder pads substantially by capillary attraction during the soldering of said board, sand snap bar having its exposed surface spaced at least about 0.0311 in. (0.076 cm) away from said array of solder pads on said circuit board.

2. The printed circuit board of claim 1, wherein said array comprises a row of substantially equally spaced solder pads.

3. The printed circuit board of claim 2, wherein said snap bar comprises a plated surface disposed substantially equidistant from each insular solder pad of said row.

4. The printed circuit board of claim 1, wherein said array comprises two substantially parallel rows of substantially equally spaced solder pads.

5. The printed circuit board of claim 4, wherein said snap bar comprises a plated surface of said circuit board disposed substantially equidistant from a pair of solder pads at one end of said two substantially parallel rows.

6. The printed circuit board of claim 5, wherein said snap bar is disposed at least 0.030 in (0.076 cm) from said end of said two substantially parallel rows.

7. The printed circuit board of claim 1, wherein said snap bar and said solder pads comprise discrete plated portions of said printed circuit board.

8. The printed circuit board of claim 7, wherein said discrete plated portions comprise a tinned copper surface.

9. The printed circuit board of claim 1, wherein said snap bar has a surface area of at least twice that of a closest solder pad in said array.

10. The printed circuit board of claim 1, wherein said lead wire protrudes about 0.015 in (0.0381 cm) from said board.

11. The printed circuit board of claim 1, wherein said array of insular solder pads is disposed in a center region of said printed circuit board.

12. The printed circuit board of claim 1, wherein said lead wire protrudes about 0.008-0.023 in (0.020-0.058 cm) from said printed circuit board.

13. A printed circuit board comprising an array of component leads disposed within insular solder pads, said board comprising at least two substantially parallel rows of substantially equally spaced pads with corresponding first and second row ends; and a snap bar comprising a discrete plated portion of said printed circuit board substantially equidistantly disposed at least about 0.030 in (0.076 cm) from at least a plurality of said solder pads in said parallel rows for drawing an amount of molten solder away from said plurality of solder pads substantially by capillary attraction during the soldering of said board, said snap bar having a capillary surface area of at least about twice that of a first of said plurality of solder pads.

14. A printed circuit board, comprising an array of insular solder pads, each of said solder pads contacting a lead wire disposed through an opening in said board and protruding therefrom about 0.15 in (0.381 cm) for receiving molten solder substantially by capillary attraction during the soldering of said board.

15. The printed circuit board of claim 14, wherein said leads are disposed in a center region of said printed circuit board.

* * * * *